United States Patent [19]

Mitsunaga et al.

[11] Patent Number: 5,440,165
[45] Date of Patent: Aug. 8, 1995

[54] SEMICONDUCTOR DEVICE WITH MEANS FOR SUPPRESSING ELECTRIC FIELDS

[75] Inventors: Kazumasa Mitsunaga; Kaoru Motonami; Hisaaki Yoshida, all of Hyogo, Japan

[73] Assignee: Mitsubishi Denki Kabushiki Kaisha, Tokyo, Japan

[21] Appl. No.: 302,482

[22] Filed: Sep. 12, 1994

Related U.S. Application Data

[63] Continuation of Ser. No. 45,620, Apr. 9, 1993, abandoned.

[30] Foreign Application Priority Data

Aug. 3, 1992 [JP] Japan .................. 4-206641

[51] Int. Cl.⁶ ................ H01L 21/336; H01L 29/784; H01L 31/068
[52] U.S. Cl. .................. 257/408; 257/345; 257/399; 257/344; 257/376
[58] Field of Search ............... 257/408, 344, 336, 335, 257/336, 337, 344, 372, 913, 617, 611, 612, 610, 376, 373

[56] References Cited

U.S. PATENT DOCUMENTS 4,716,451  12/1987  Hsu et al. ............................ 257/372
5,276,346  1/1994   Iwai et al. ........................... 257/408

FOREIGN PATENT DOCUMENTS 2-133929  5/1990  Japan .

OTHER PUBLICATIONS

Chang et al.; "High Voltage FET Integrated Circuit Process"; IBM Technical Disclosure Bulletin, vol. 16, No. 5, Oct. 1973.
L. K. Wang et al., "On the Effects of Implantation of Ions in the MeV Energy Range into Silicon", Solid-State Electronics, vol. 29, No. 7, pp. 739-743.
S. Isomae et al., "A New Two-Dimensional Silicon Oxidation Model", IEEE Transactions on Computer-Aided Design, vol. CAD-6, No. 3, May 1987, pp. 410-416.

Primary Examiner—Robert P. Limanek
Assistant Examiner—Wael M. Fahmy
Attorney, Agent, or Firm—Lowe, Price, LeBlanc & Becker

[57] ABSTRACT

An element separating oxide film is formed in a surface of a p-type silicon substrate for separation of an element forming region. A p-type impurity diffusion region extends from the vicinity of a lower surface of the element separating oxide film to a position at a predetermined depth in the element forming region. The p-type impurity diffusion region has a peak of concentration of impurity. In the element forming region adjacent to the element separating oxide film, an n+ impurity diffusion region is formed on the surface of the p-type silicon substrate. An n− impurity diffusion region adjacent to the n+ impurity diffusion region is formed between the n+ impurity diffusion region and the p-type impurity diffusion region.

7 Claims, 13 Drawing Sheets

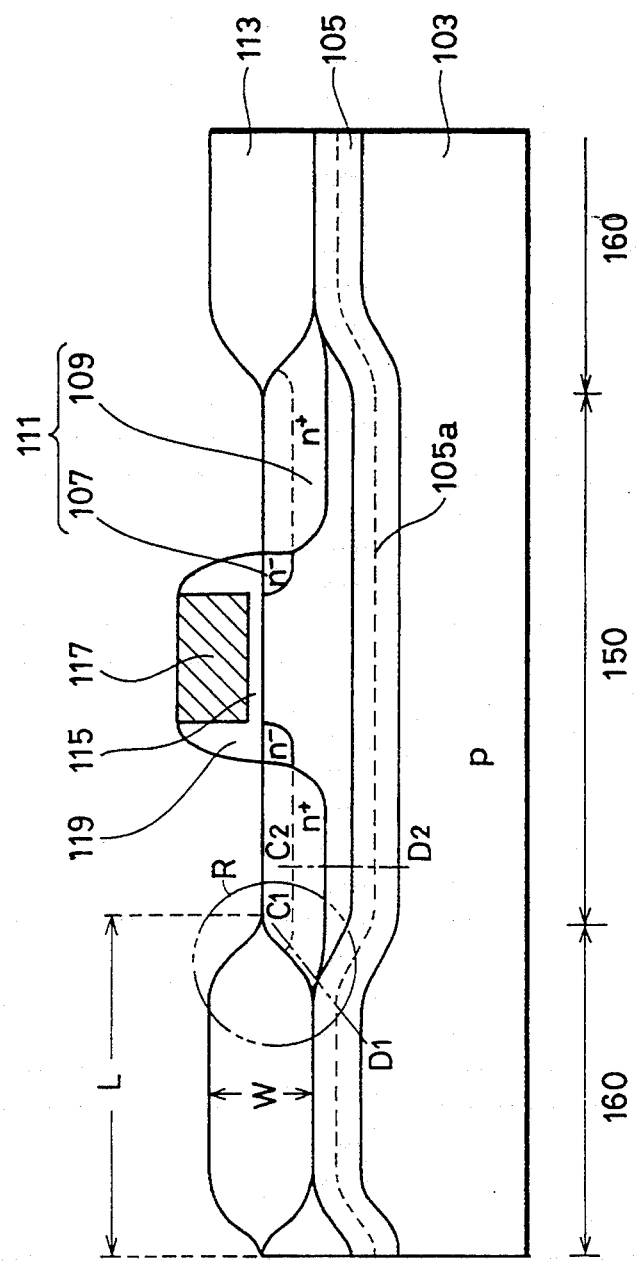

SEMICONDUCTOR DEVICE WITH MEANS FOR SUPPRESSING ELECTRIC FIELDS

This application is a continuation of Application Ser. No. 08/045,620 filed Apr. 9, 1993, now abandoned.

BACKGROUND OF THE INVENTION

1. Field of the Invention

The present invention relates to a semiconductor device and a manufacturing method of the same, and in particular, to a structure of a p-n junction and a manufacturing method of the same.

2. Description of the Background Art

A structure of a conventional n-channel transistor will be described below with reference to the drawings.

FIG. 12 is a cross section schematically showing a conventional n-channel transistor. Referring to FIG. 12, element separating oxide films 113 are formed in a surface of a p-type silicon substrate 103 in element separating regions 160. The element separating oxide films 113 separate and define an element forming region 150 on the p-type silicon substrate 103. An n-channel transistor is formed on the element forming region 150.

The n-channel transistor includes a pair of source/drain diffusion regions 111, a gate oxide film 115 and a gate electrode 117. The pair of source/drain diffusion regions 111 are formed on the surface of the p-type silicon substrate 103 with a predetermined space between each other. Each of the source/drain diffusion regions 111 has a double structure formed of an n$^-$ impurity diffusion region 107 and an n$^+$ impurity diffusion region 109, and thus has an LDD (lightly doped drain) structure. Owing to the LDD structure of the source/drain diffusion region 111, the intensity of electric field in a channel direction near the drain region is reduced, and thus the generation of hot electrons is suppressed. The source/drain diffusion regions 111 are adjacent to the element separating oxide films 113. The gate electrode 117 is formed on the region between the pair of source/drain diffusion regions 111 with the gate oxide film 115 therebetween. Side surfaces of the gate electrode 117 are covered with side walls 119.

A p-type impurity diffusion region 105 is formed in the p-type silicon substrate 103. In the element separating regions 160, the p-type impurity diffusion region 105 is adjacent to lower surfaces of the separating oxide films 113, and in the element forming region 150, it is located near the under side of the n-channel transistor. The concentration of p-type impurity in the p-type impurity diffusion region 105 is larger than that in the p-type silicon substrate 103. The p-type impurity diffusion region 105 has a peak of concentration of impurity represented by dotted line 105a. The p-type impurity diffusion region 105 has portions, which are located near the lower ends of the element separating oxide films 113 and are substantially in contact with the n$^+$ impurity diffusion regions 109. The p-type impurity diffusion region 105 and element separating oxide films 113 serve to electrically separate the n-channel transistor from other elements.

The concentration of impurity in the p-type silicon substrate 103 is $10^{15}$ cm$^{-3}$. The concentration of impurity in the p-type impurity diffusion region 105 is between $10^{17}$ and $10^{18}$ cm$^{-3}$. The concentration of impurity in the n$^-$ impurity diffusion region 107 is between $10^{17}$ and $10^{18}$ cm$^{-3}$. The concentration of impurity in the n$^+$ impurity diffusion region 109 is approximate, but does not exceed $10^{20}$ cm$^{-3}$.

Now, a manufacturing method of the n-channel transistor shown in FIG. 12 will be described below.

FIGS. 13–20 are schematic cross sections showing steps in the manufacturing method of the n-channel transistor in the prior art.

Referring to FIG. 13, a thin silicon oxide film 121 is formed on the whole surface of the p-type silicon substrate 103. A silicon nitride film 123 is formed on the whole surface of the thin silicon oxide film 121.

Referring to FIG. 14, a photoresist 125 is applied to the whole surface of the silicon nitride film 123. The photoresist 125 is patterned, e.g., by an exposure processing. Using the patterned photoresist 125 as a mask, the silicon nitride film 123 is patterned.

Referring to FIG. 15, the photoresist 125 is removed. Using the silicon nitride film 123 as a mask, portions not covered with the silicon nitride film 123 are selectively oxidized, so that the separating oxide films 113 are formed in the surface of the p-type silicon substrate 103.

Referring to FIG. 16, the thin silicon oxide film 121 and the silicon nitride film 123 located in the element forming region of the p-type silicon substrate 103 are sequentially etched. Thereafter, boron (B) is ion-implanted into the whole surface of the p-type silicon substrate 103. This implantation forms the p-type impurity diffusion region 105 in the p-type silicon substrate 103. In the element separating regions, the p-type impurity diffusion region 105 is located near the lower surfaces of the element oxide films 113, and in the element forming region, it is located at a predetermined depth from the surface of the p-type silicon substrate 103. The concentration of impurity in the p-type impurity diffusion region 105 is higher than that in the p-type silicon substrate 103.

Referring to FIG. 17, the thin silicon oxide film 115 is formed on the exposed surface of the p-type silicon substrate 103, e.g., by thermal oxidation. The polysilicon layer 117 is formed on the whole surface of the silicon substrate 103.

Referring to FIG. 18, the thin silicon oxide film 115 and polysilicon layer 117 are sequentially patterned, e.g., by the photolithography or RIE method. Thereby, the gate electrode 117 and gate oxide film 115 are formed. Using the gate electrode 117 and element separating oxide films 113 as a mask, phosphorus (P) is ion-implanted into the whole surface of the silicon substrate 103. This implantation forms the pair of n$^-$ impurity diffusion regions 107, which are located at opposite sides of a region under the gate electrode 117, on the surface of the p-type silicon substrate 103.

Referring to FIG. 19, a silicon oxide film 119 is formed on the whole surface of the p-type silicon substrate 103. Anisotropic etching is applied to the silicon oxide film 119, whereby the side walls 119 covering the side surfaces of the gate electrode 117 are formed.

Referring to FIG. 20, the side walls 119, gate electrode 117 and element separating oxide films 113 are used as a mask for ion implantation of arsenic (As) into the whole surface of the p-type silicon substrate 103. This implantation forms the pair of n$^+$ impurity diffusion regions 109, which are located at opposite sides of a region under the gate electrode 117 and side walls 119. The n$^+$ impurity diffusion layers 109 and n$^-$ impurity diffusion layers 107 form the source/drain diffusion regions 111 having the LDD structure.

In the description, "n+" indicates that the n-type impurity is contained at a relatively high concentration, and "n−" indicates that the n-type impurity is contained at a relatively low concentration.

The conventional n-channel transistor has the structure and is formed as described above.

Integration of elements to a higher extent inevitably requires miniaturization of the elements. This also requires the miniaturization of the element separating oxide films which electrically separate the elements from each other. More specifically, a length L and a thickness W of the element separating oxide film 113 shown in FIG. 12 are reduced. The reduction of sizes of the element separating oxide film may impair the effect for electrically separating the elements from each other. For this reason, the p-type impurity diffusion region 105 is formed in order to increase the effect for electrically separating the elements from each other. The portions of the p-type impurity diffusion region 105 located in the element separating regions 160 serve mainly as a channel cut layer for preventing generation of an inversion layer at an interface between the insulator and semiconductor. The portion of the p-type impurity diffusion region 105 located in the element forming region 150 has functions including suppression of a latch-up phenomenon, e.g., in a complementary MOS (metal oxide semiconductor) transistor. In the latch-up phenomenon, current flows from a power supply terminal ($V_{DD}$) to a ground terminal in an IC (integrated circuit) of the complementary MOSs without interruption. As described above, the p-type impurity diffusion region 105 is provided for the electrical separation of the elements in order to comply with the high integration of the elements.

However, the integration to a further extent requires further increase of the electrically separating effect. In order to satisfy this requirement in the n-channel transistor shown in FIG. 12, the concentration of the p-type impurity in the p-type impurity diffusion region 105 must be increased.

Meanwhile, the miniaturization of elements also requires improvement of the current driving capacity of the elements. In order to improve the current driving capacity in the n-channel transistor shown in FIG. 12, the concentration of n-type impurity in the source/drain regions must be increased. As described above, the concentration of p-type impurity in the p-type impurity diffusion region 105 and the concentration of n-type impurity in the n+ impurity diffusion region 109 must be high in view of the further integration.

FIG. 21A shows change of carrier concentration at positions along line $C_1$-$D_1$ in FIG. 12. FIG. 21B shows change of carrier concentration at positions along line $C_2$-$D_2$ in FIG. 12.

Referring to FIG. 12 and FIGS. 21A and 21B, the concentrations of impurity in the p-type impurity diffusion region 105 and n+ impurity diffusion region 109 have large values in view of the further integration. As the impurity concentrations increase, the carrier concentrations also increase. In this case, a p-type impurity region and an n-type impurity region, each of which has a high carrier concentration, are adjacent to each other at a location near the p-n junction formed at the region between the p-type impurity diffusion region 105 and n+ impurity diffusion region 109. In the p-n junction, the p-type and n-type carriers cancel each other, so that a region without a carrier, a depletion layer is formed. In the case where the p-type and n-type impurity regions having high carrier concentrations are adjacent to each other, the concentration of n-type carrier at a position between the depletion layer of the p-n junction and the n+ impurity diffusion layer 109 rapidly increases in accordance with increase of the distance from the depletion layer. Meanwhile, the concentration of p-type carrier at a position between the depletion layer of the p-n junction and the p-type impurity diffusion layer 105 rapidly increases in accordance with increase of the distance from the depletion layer. Therefore, gradients of concentrations of p-type and n-type carriers near the p-n junction are large. The gradient of concentration of carrier is equal to a rate of change of the carrier concentration with respect to a displacement of the position, and is represented by the inclination of alternate long and short dash line $n_3$—$n_3$ or $n_4$—$n_4$, or alternate long and two short dashes line $p_3$—$p_3$ or $p_4$—$p_4$. If the gradient of the carrier concentration is large, the absolute value of the inclination, e.g., of alternate long and short dash line $n_3$—$n_3$ is large.

FIGS. 21A and 21B do not show the concentrations of carriers at and near the surface of the p-type silicon substrate 103, and show the concentrations of carriers only at regions designated by alternate long and short dash line $C_1$-$D_1$ and $C_2$-$D_2$ in FIG. 12. In FIGS. 21A and 21B, the depletion layer formed at the p-n junction is eliminated for simplicity reason.

As described above, in the case where the impurity concentration at the p-type impurity diffusion region 105 and n+ impurity diffusion region 109 are increased in view of the high integration, the gradients of concentrations of carriers near the p-n junctions increase, which results in the following disadvantage.

FIGS. 22A and 22B schematically show a section of a portion corresponding to a region R encircled with alternate long and two short dashes line in FIG. 12, and show results of simulation relating to concentration of the electrical field. FIG. 22A shows the result in the case where the source/drain regions are formed by single ion-implantation of arsenic (As), and FIG. 22B shows the result in the case where the source/drain regions are formed by double ion-implantation of phosphorus (P). Conditions for the simulation are that the concentration of n-type impurity in the source/drain region 211 is $10^{20}$ cm$^{-3}$, the concentration of impurity in the p-type silicon substrate 203 is $10^{17}$ cm$^{-3}$, and the concentration of impurity in the p-type impurity diffusion region 205 is $10^{18}$ cm$^{-3}$. A reverse bias potential of 9 V is applied to the p-n junction formed between the source/drain region 211 and the p-type silicon substrate 203 or p-type impurity diffusion region 205. In the figure, dotted lines 231, 232 and 233 are contour lines of the field intensities of $0.8 \times 10^6$ V/cm, $1.0 \times 10^6$ V/cm and $1.2 \times 10^6$ V/cm, respectively. From the results of simulation, it has been found that a high field generates along the p-n junction in the case where the n-type and p-type impurity regions of the high concentrations are adjacent to each other. In particular, it has been found that a higher field generates at the p-n junction in which a relative distance between the n-type impurity region (source/drain region) and the p-type impurity region of the high concentrations is small.

For the above reason, it can be estimated that a higher field generates along the p-n junction formed between the p-type impurity diffusion region 105 and n+ impurity diffusion region 109 shown in FIG. 12 if the concentration of carriers of these regions 105 and 109 are further increased.

Meanwhile, the gradients of carrier concentrations near the p-n junction are large, as shown in FIGS. 21A and 21B, so that a diffusion current is liable to generate near the p-n junction.

FIG. 23 is a diagram for showing that the diffusion current is liable to generate if the gradient of concentration of carrier is large. Referring to FIG. 23, the abscissa indicates the concentration of carrier, and the ordinate indicates the spatial position. In general, the carrier has the tendency that it moves from a region of a high concentration carrier to a region of a lower concentration. In the case of curve $t_1$ representing the high gradient of carrier concentration, the carrier is liable to move to a peripheral region of the low carrier concentration. If the carrier in the state represented by the curve $t_1$ moves to the peripheral region of the low carrier concentration, the concentration of carrier with respect to the position attains the state represented by the curve $t_2$, and further changes to the state represented by the curvature $t_3$. Thus, the state of the concentration of carrier changes to the state of the small gradient of the lower carrier concentration. The carrier moves owing to the diffusion, as described above. Since the carrier has an electric charge, the movement of carrier generates the diffusion current. The diffusion current generates to a higher extent in accordance with increase of the gradient of carrier concentration, as described above.

For the foregoing reason, in the case of the large gradient of concentration of carrier near the p-n junction in the region between the p-type impurity diffusion region 105 and $n^+$ impurity diffusion region 109, it is estimated that a high electric field generates at the p-n junction if a reverse bias potential is applied, and that the diffusion current is liable to generate. Therefore, application of the reverse bias potential to the p-n junction causes such a disadvantage that the leak current is liable to generate at the p-n junction due to actions of the high field and diffusion current.

The leak current may be caused also by a reason other than the foregoing. Referring to FIG. 12, defect is introduced into side edges of the element separating oxide films 113 during the formation of the element separating oxide films 113. If the defect distributes in the depletion layer during the operation of the element, the current leaks from the defect, i.e., the leak current generates. However, the leak current caused by the defect can be prevented in a semiconductor device disclosed in the Japanese Patent Laying-Open No. 2-133929 (1990).

The semiconductor device disclosed in this publication is shown in FIG. 24. FIG. 24 is a schematic cross section of the semiconductor device disclosed in this publication. Referring to FIG. 24, field insulating films 313 are selectively formed on a silicon substrate 303. At the vicinity of the under surfaces of the field insulating films 313, $p^+$ channel cut layers 305 are formed in the p-type silicon substrate 303. The field insulating films 313 and $p^+$ channel cut layers 305 separate and define an element forming region, in which a MOS transistor is formed.

The MOS transistor includes a pair of source and drain regions 301, 307 and 309, a gate insulating film 315 and a gate electrode 317. The pair of source and drain regions 301, 307 and 309, which form the LDD structure, are formed on the p-type silicon substrate 303. The gate electrode 317 is formed on the surface of the region located between the pair of source and drain regions with the gate insulating film 315 therebetween.

According to the structure of the semiconductor device shown in the foregoing publication, the source/drain regions include the regions 301 which extend along and contact with the side edges of the field insulating films 313. Owing to the provision of the n-type source and drain regions 301, the crystal defect, which was introduced into the p-type silicon substrates 303 during the formation of the field insulating films 313, is contained in the n-type source and drain regions 301. Therefore, the crystal defect introduced into the side edges of the field insulating films 313 does not distribute into depletion layers during the operation of the MOS transistor, so that junction leak is prevented and element characteristics are improved.

The above matter is disclosed in the foregoing publication.

SUMMARY OF THE INVENTION

Accordingly, it is an object of the invention to provide a semiconductor device of which electrical reliability is improved.

Another object of the invention is to provide a semiconductor device of which current driving capacity is improved.

Still another object of the invention is to provide a semiconductor device capable of reducing a leak current, which may be caused by application of a reverse bias potential to a p-n junction.

Yet another object of the invention is to provide a method for manufacturing a semiconductor device of which electrical reliability is improved.

Further another object of the invention is to provide a method for manufacturing a semiconductor device of which current driving capacity is improved.

Further object of the invention is to provide a method for manufacturing a semiconductor device capable of reducing a leak current, which may be caused by application of a reverse bias potential to a p-n junction.

In order to achieve the above objects, the semiconductor device according to the invention includes a semiconductor substrate, a separating and insulating film, a region having a peak of concentration of impurity, a first impurity region, and a second impurity region. The semiconductor substrate is of a first conductivity type, and has a main surface. The separating and insulating film is formed on the main surface of the semiconductor substrate for separation of an element forming region. The region having the peak of concentration of impurity is of the first conductivity type, is located in the semiconductor substrate and extends from the vicinity of a lower surface of the separating and insulating film to position at a predetermined depth in the element forming region. The first impurity region, which is of a second conductivity type and has a first concentration, is located in the element forming region adjacent to the separating and insulating film and is formed in the main surface of the semiconductor substrate. The second impurity region, which is of the second conductivity type and has a second concentration lower than the first concentration, is located between the first impurity region and the peak of concentration of impurity of the first conductivity type and is in contact with the first impurity region.

According to the semiconductor device described above, the second impurity region is formed between the first impurity region of the second conductivity type and the peak of concentration of impurity of the first conductivity type. The second impurity region is of the second conductivity type, and has the second concentration lower than the first concentration of the first impurity region. Owing to the provision of the second impurity region, the concentration of impurity of the second conductivity type is reduced stepwise in a region between the first impurity region and the peak of concentration of impurity of the first conductivity type. Thus, at the vicinity of a p-n junction, which is formed in the region between the first impurity region and the peak of concentration of impurity of the first conductivity type, the gradient of the concentration of at least the impurity of the second conductivity type can be reduced. Since the gradient of concentration of impurity of the second conductivity type is reduced at the vicinity of the p-n junction, generation of a diffusion current at an area having the reduced gradient can be suppressed, and also concentration of a high electric field at and around the p-n junction can be suppressed. Therefore, a leak current, which may be generated by actions of the diffusion current and concentration of a high field at the vicinity of the p-n junction, can be reduced. This improves a current driving capacity, and improves electrical reliability of the semiconductor device.

The invention also provides a manufacturing method of a semiconductor device, overcoming the foregoing disadvantages, which comprises the following steps.

A separating and insulating film is formed on a main surface of a semiconductor substrate of a first conductivity type for separation of an element forming region. Then, there is formed a region, which has a peak of concentration of impurity of a first conductivity type and extends in the semiconductor substrate from the vicinity of a lower surface of the separating and insulating film to a position at a predetermined depth in the element forming region. There is formed a first impurity region, which is of a second conductivity type, has a first concentration and is located in the main surface of the semiconductor substrate, in the element forming region adjacent to the separating and insulating film. There is formed a second impurity region, which is of a second conductivity type, has a second concentration lower than the first concentration, is in contact with the first impurity region and is located between the first impurity region and the peak of concentration of impurity of the first conductivity type.

The foregoing and other objects, features, aspects and advantages of the present invention will become more apparent from the following detailed description of the present invention when taken in conjunction with the accompanying drawings.

BRIEF DECRYPTION OF THE DRAWINGS

FIG. 12 is a schematic cross section of an n-channel transistor in the prior art;

DESCRIPTION OF THE PREFERRED EMBODIMENT

A structure of an n-channel transistor of the invention will be described below with reference to the drawings.

Figure 1:
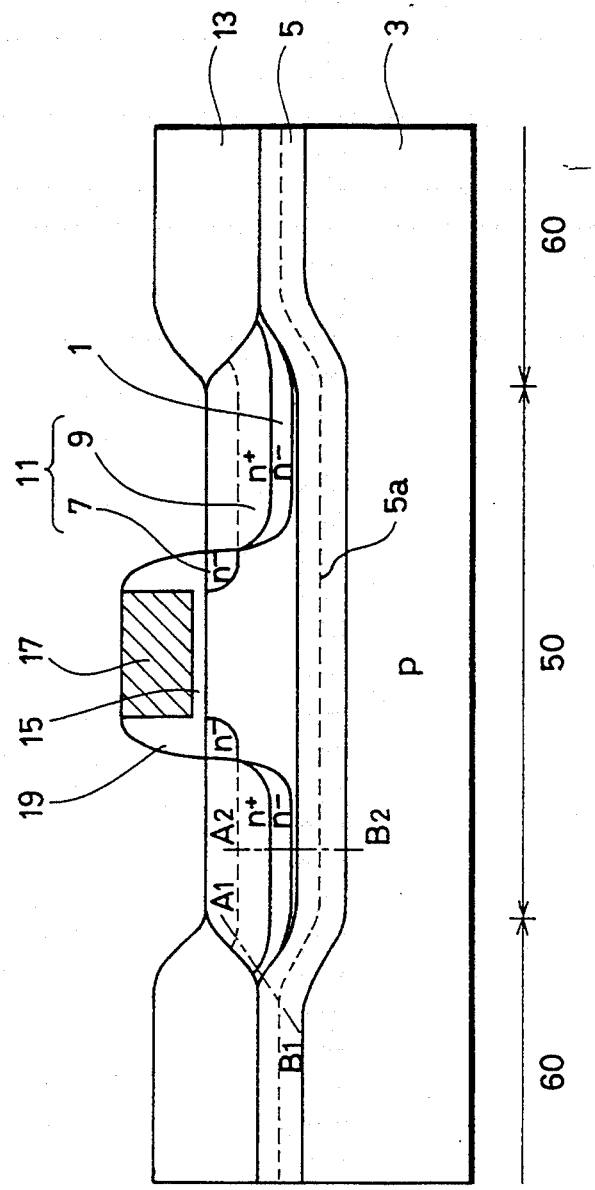
FIG. 1 is a schematic cross section of an n-channel transistor of an embodiment of the invention.

Referring to FIG. 1, element separating and insulating oxide films 13 made of silicon oxide are formed in surfaces of element separating regions 60 of a p-type silicon substrate 3. An n-channel transistor is formed on a surface of an element forming region 50 of the p-type silicon substrate 3.

The n-channel transistor includes a pair of source/drain diffusion regions 11, a gate oxide film 15 and a gate electrode 17. The pair of source/drain diffusion regions 11 are formed in the surface of the element forming region 50 of the p-type silicon substrate 3 with a predetermined space between each other. Each source/drain diffusion region 11 has an LDD structure. Thus, each source/drain diffusion region 11 has a double structure formed of an $n^-$ impurity diffusion region 7 and an $n^+$ impurity diffusion region 9. The gate electrode 17 is formed on a surface of a region located between the pair of source/drain diffusion regions 11 with the gate oxide film 15 therebetween. Side surfaces of the gate electrode 17 are covered with side walls 19.

A p-type impurity diffusion region 5 is formed in the p-type silicon substrate 3. In the element separating regions 60, the p-type impurity diffusion region 5 is located near the lower surfaces of the element separating oxide films 13. In the element forming region 50, the p-type impurity diffusion region 5 is located at a predetermined depth from the surface of the p-type silicon substrate 3. The p-type impurity diffusion region 5 has a peak of concentration of impurity at a position indicated by dotted line 5a. An $n^-$ impurity diffusion region 1, which is in contact with the impurity diffusion region 9, is formed between the p-type impurity diffusion region 5 and each $n^+$ impurity diffusion region 9.

The concentration of impurity in the p-type silicon substrate 3 is $10^{15}$ cm$^{-3}$. The concentration of impurity in the p-type impurity diffusion region 5 is between $10^{17}$ and $10^{18}$ cm$^{-3}$. The concentration of impurity in the $n^-$ impurity diffusion region 7 is between $10^{17}$ and $10^{18}$ cm$^{-3}$. The concentration of impurity in the $n^+$ impurity diffusion region 9 is approximate, but does not exceed $10^{20}$ cm$^{-3}$. The concentration of impurity in the $n^-$ impurity diffusion region 1 is between $10^{17}$ and $10^{18}$ cm$^{-3}$.

Now, a manufacturing method of the n-channel transistor of the embodiment will be described below.

Figure 2:
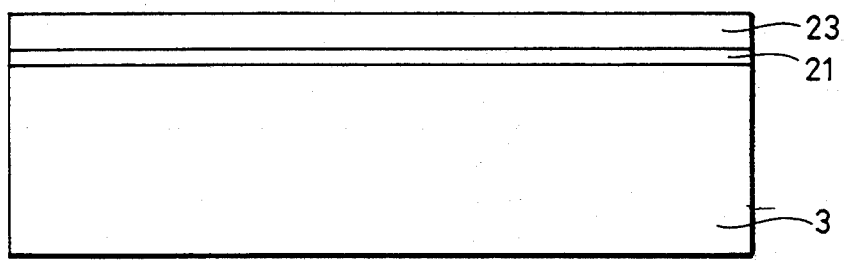
FIGS. 2-10 are schematic cross sections sequentially showing steps of a manufacturing method of an n-channel transistor of an embodiment of the invention.

Referring to FIG. 2, a thin silicon oxide film 21 is formed on the whole surface of the p-type silicon substrate 3. A silicon nitride film 23 is formed on the whole surface of the thin silicon oxide film 21.

Figure 3:
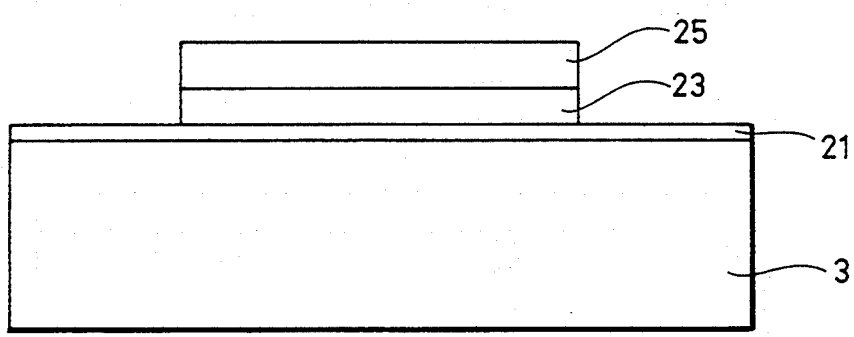

Referring to FIG. 3, a photoresist 25 is applied to the whole surface of the silicon nitride film 23. The photoresist 25 is patterned, e.g., by an exposure processing. Using the patterned photoresist 25 as a mask, the silicon nitride film 23 is etched.

Figure 4:
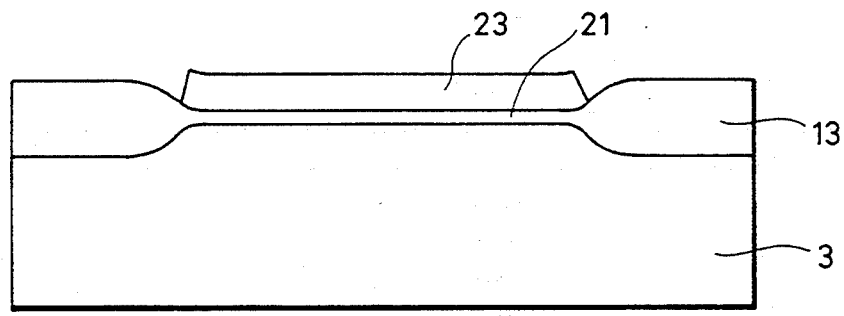

Referring to FIG. 4, the photoresist 25 is removed. Using the etched silicon nitride film 23 as a mask, portions not covered with the silicon nitride film 23 are selectively oxidized, so that the separating oxide films 13 are formed on the surface of the p-type silicon substrate 3.

Figure 5:
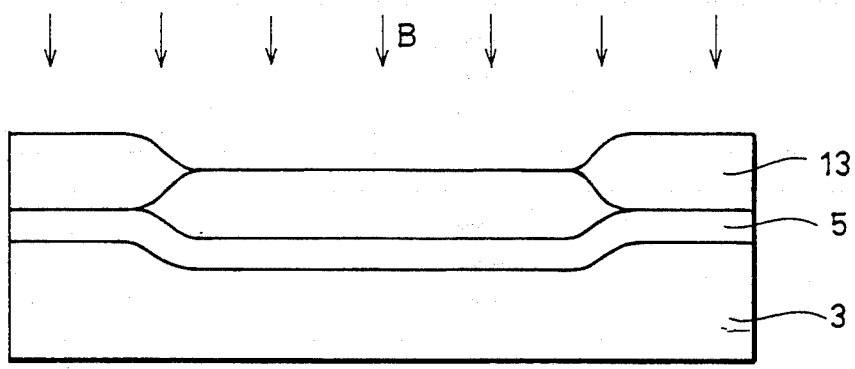

Referring to FIG. 5, the silicon nitride film 23 and the thin silicon oxide film 21 located on the surface of the element forming region are sequentially etched. Boron (B) is ion-implanted into the whole surface of the p-type silicon substrate 3. This implantation is carried out under the conditions of an acceleration voltage between 100 and 150 KeV and a dose between $3 \times 10^{12}$ and $5 \times 10^{12}$ cm$^{-2}$. The ion-implantation forms the p-type impurity diffusion region 5 in the p-type silicon substrate 3. In the element separating regions, the p-type impurity diffusion region 5 is located near the lower surfaces of the element oxide films 13, and in the element forming region, it is located at a predetermined depth from the surface of the p-type silicon substrate 3.

Figure 6:
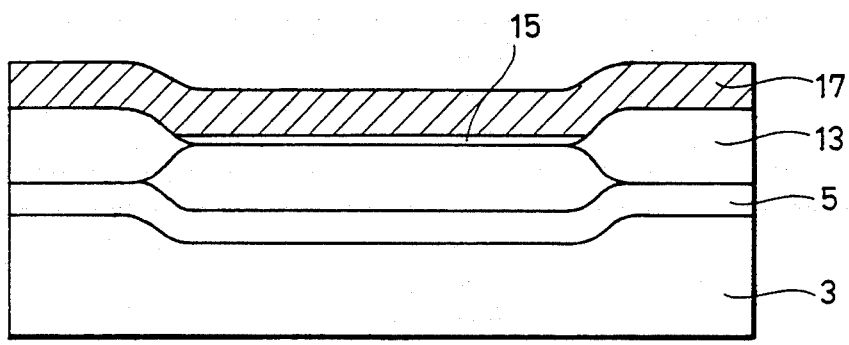

Referring to FIG. 6, the thin silicon oxide film 15 is formed on the exposed surface of the p-type silicon substrate 3, e.g., by thermal oxidation. The polysilicon layer 17 is formed on the whole surface of the p-type silicon substrate 3.

Figure 7:
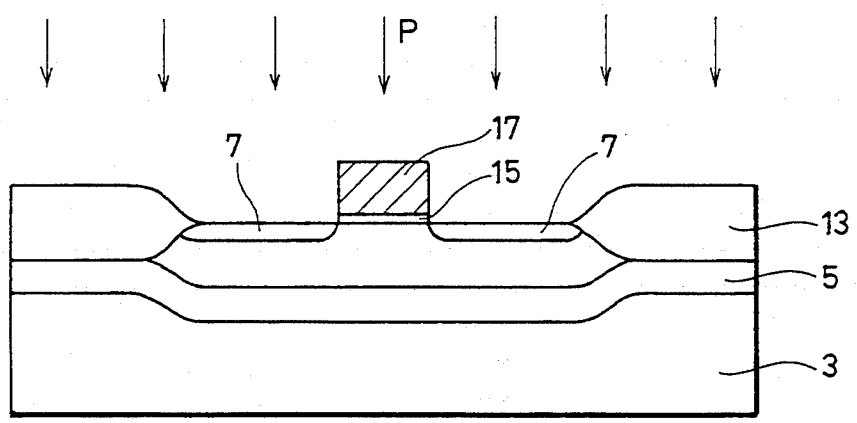

Referring to FIG. 7, polysilicon layer 17 and the thin silicon oxide film 15 are sequentially patterned, e.g., by the photolithography or RIE method. Thereby, the gate oxide film 15 and gate electrode 17 are formed. Using the gate electrode 17 and element separating oxide film 13 as a mask, phosphorus (P) is ion-implanted into the whole surface of the p-type silicon substrate 3. This implantation is carried out under the conditions of an acceleration voltage between 30 and 40 KeV and a dose between $1 \times 10^{13}$ and $3 \times 10^{13}$ cm$^{-2}$. This implantation forms the pair of n$^-$ impurity diffusion regions 7, which are located at opposite sides of a region under the gate electrode 17.

Figure 8:
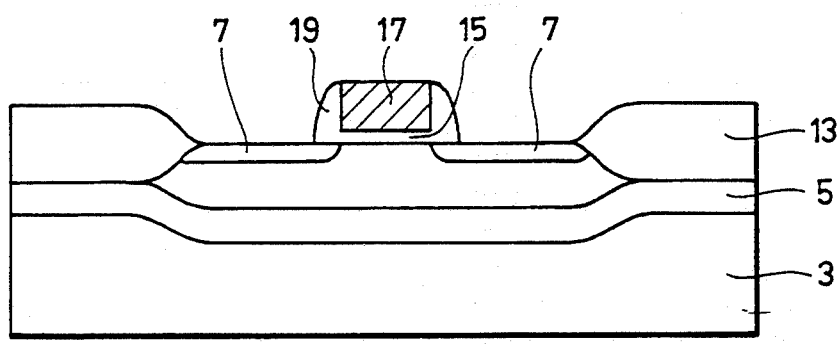

Referring to FIG. 8, a silicon oxide film 19 is formed on the whole surface of the p-type silicon substrate 3. Anisotropic etching is applied to the silicon oxide film 19, whereby the side walls 19 covering the side surfaces of the gate electrode 17 are formed.

Figure 9:
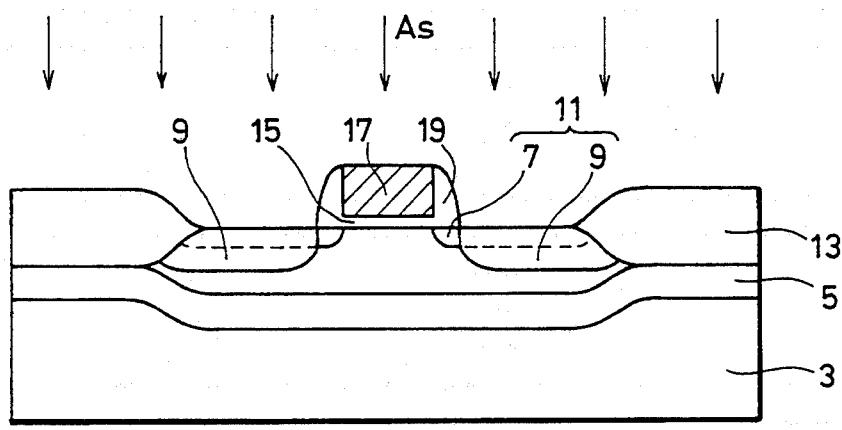

Referring to FIG. 9, the gate electrode 17, side walls 19 and element separating oxide films 13 are used as a mask for ion-implantation of arsenic (As). This implantation is carried out under the conditions of an acceleration voltage between 30 and 60 KeV and a dose between $1 \times 10^{15}$ and $3 \times 10^{15}$ cm$^{-2}$. This implantation forms the pair of n$^+$ impurity diffusion regions 9, which are located at opposite sides of a region under the gate electrode 17 and side walls 19. The n$^+$ impurity diffusion layers 9 and n$^-$ impurity diffusion layers 7 form the source/drain diffusion regions 11 having the LDD structure.

Figure 10:
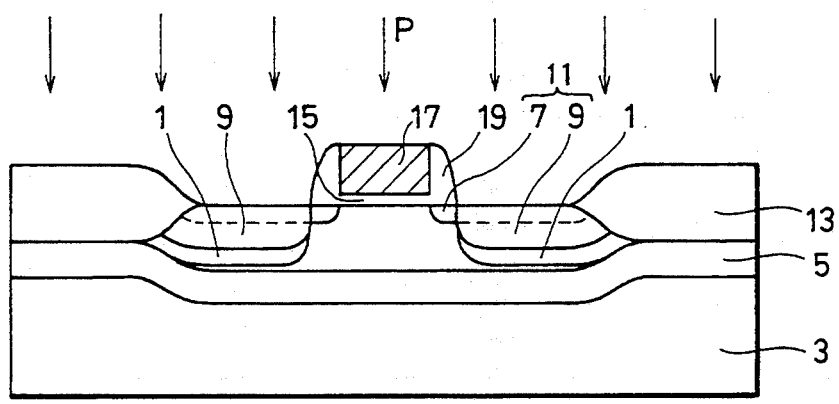

Referring to FIG. 10, the gate electrode 17, side walls 19 and element separating oxide films 13 are used as a mask for ion-implantation of phosphorus (P). This implantation is carried out under the conditions of an acceleration voltage between 30 and 60 KeV and a dose between $1 \times 10^{13}$ and $5 \times 10^-$cm$^{-2}$. This implantation forms the n$^-$ impurity diffusion regions 1, which are located at regions between the n$^+$ impurity diffusion regions 9 and p-type impurity diffusion region 5 and are in contact with the n$^+$ impurity diffusion regions 9. Thereafter, thermal oxidation is carried out.

The n-channel transistor of the embodiment has the structure and is formed as described above.

Now, description will be made on the gradient of concentration of carrier which is formed at the vicinity of the n$^+$ impurity diffusion regions 9 and p-type impurity diffusion region 5 in the n-channel transistor of an embodiment of the invention.

Figure 11A:
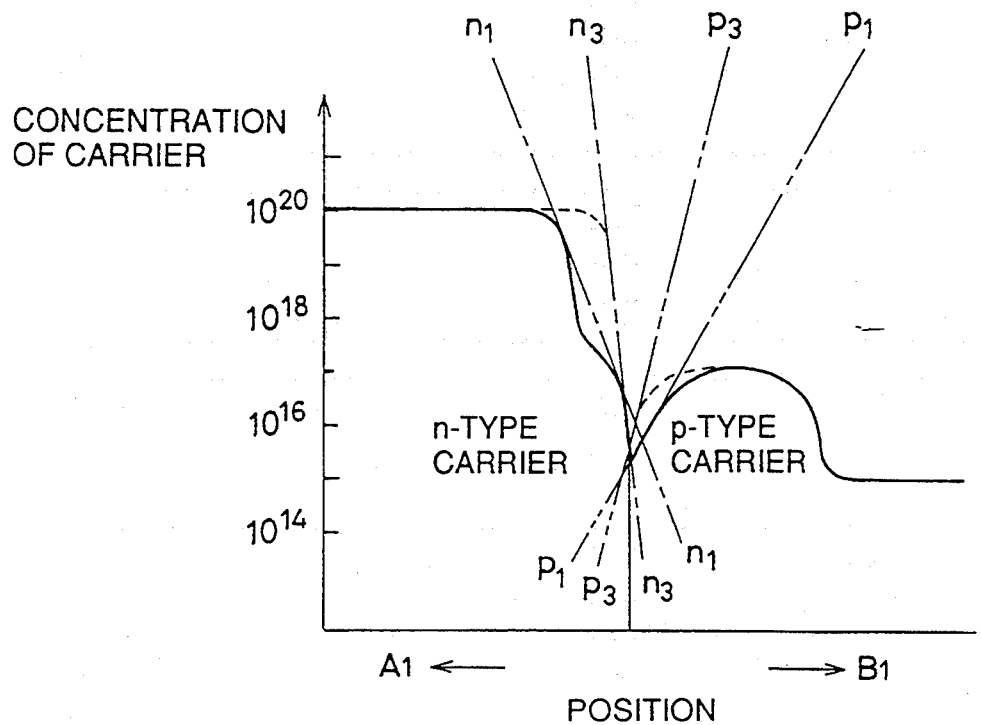
FIG. 11A shows change of carrier concentration at positions along line $A_1$-$B_1$ in FIG. 1.

Referring to FIGS. 1 and 11A, the n$^-$ impurity diffusion region 1 is formed between the n$^+$ impurity diffusion region 9 and p-type impurity diffusion region 5. The concentration of impurity in the n$^-$ impurity diffusion region 1 is smaller than that in the n$^+$ impurity diffusion region 9. Therefore, the concentration of n-type carrier decreases stepwise at the vicinity of the p-n junction formed between the p-type impurity diffusion region 5 and n$^+$ impurity diffusion region 9. Thereby, the gradient of concentration of n-type carrier decreases at the vicinity of the p-n junction. Thus, the gradient of concentration of carrier in the invention has a small absolute value, as indicated by alternate long and short dash line $n_1$—$n_1$, while the concentration in the prior art, which is represented by dotted line, has the gradient indicated by alternate long and short dash line $n_3$—$n_3$.

Along line $A_1$-$B_1$, the p-type impurity diffusion region 5 and the n$^+$ impurity diffusion region 9 are spaced through a short distance from each other. Therefore, the n-type ion, which has been implanted for forming the n$^-$ impurity diffusion region 1, is partially implanted into the p-type impurity diffusion region 5. In the region of the p-type impurity diffusion region 5 into which the n-type ion is implanted, the n-type carrier and p-type carrier cancel each other. This reduces the concentration of p-type carrier at the vicinity of the p-n junction, which is formed between the p-type impurity diffusion region 5 and n-type impurity diffusion region 9, and thus the gradient of concentration of p-type carrier decreases. Thus, according to the invention, the gradient of concentration of carrier has a small absolute value, as indicated by alternate long and two short dashes line $p_1$—$p_1$, while the concentration in the prior art, which is represented by dotted line, has the gradient indicated by alternate long and two short dashes line $p_3$—$p_3$.

According to the invention, as described hereinabove, the gradients of concentration of n-type and p-type carriers can be reduced at the vicinity of the p-n junction formed between the p-type impurity diffusion region 5 and n$^+$ impurity diffusion region 9, compared with the prior art. Since the gradients of concentration of the n-type and p-type carriers can be reduced at the vicinity of the p-n junction, the diffusion current and concentration of a high field at the vicinity of the p-n junction can be suppressed. Therefore, the leak current, which may be caused by the actions of the diffusion current and concentration of the high field at the vicinity of the p-n junction can be reduced.

Figure 11B:
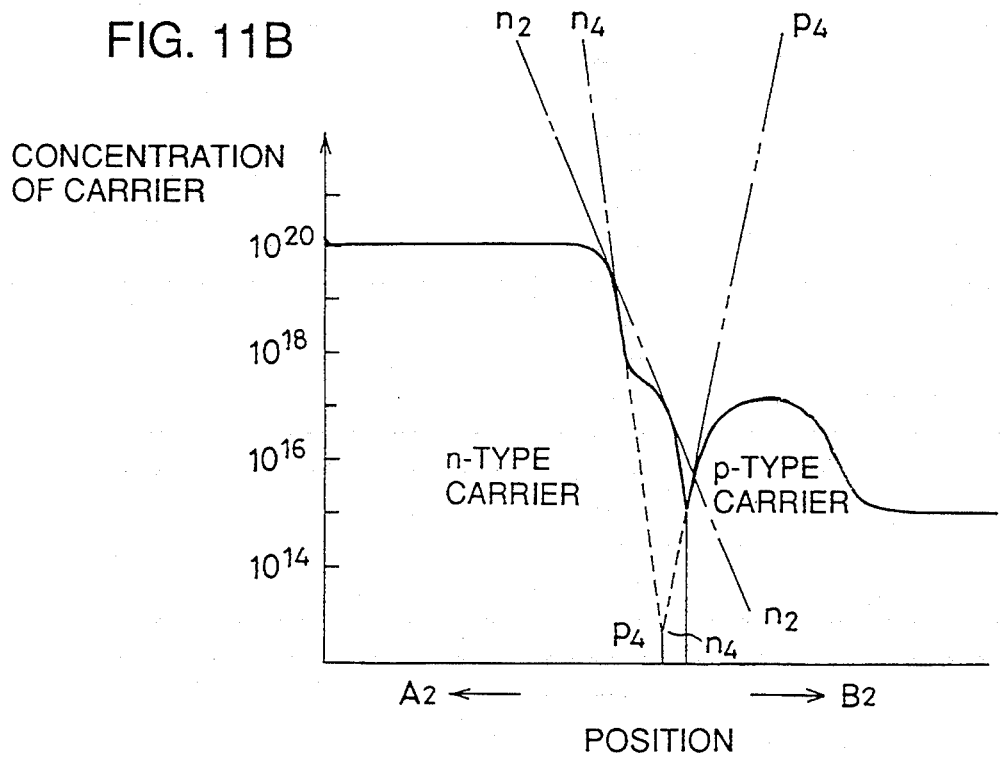
FIG. 11B shows change of carrier concentration at positions along line $A_2$-$B_2$ in FIG. 1.
Figure 13:
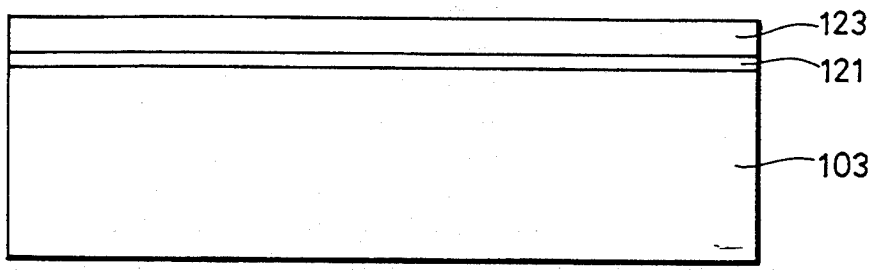
FIGS. 13-20 are schematic cross sections sequentially showing steps of a manufacturing method of an n-channel transistor in the prior art.
Figure 14:
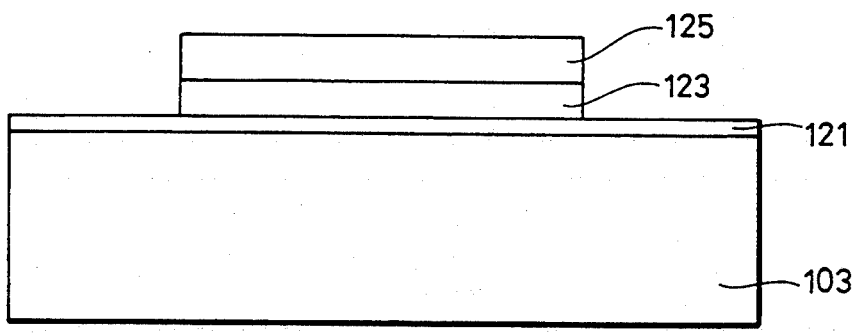
Figure 15:
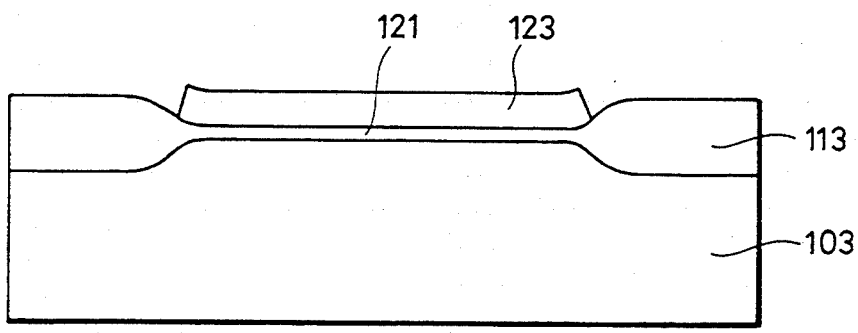
Figure 16:
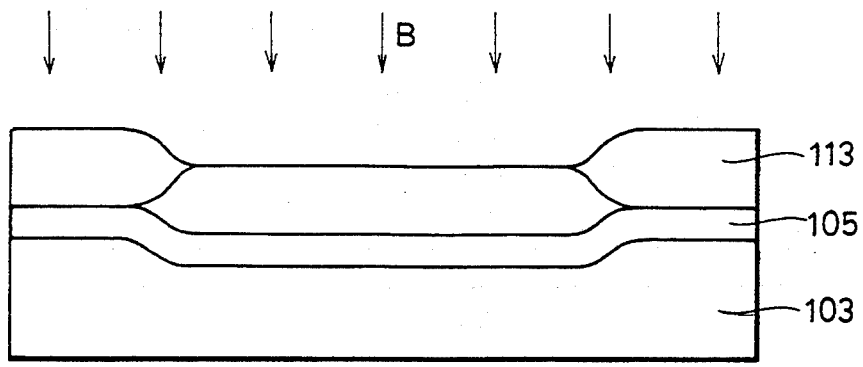
Figure 17:
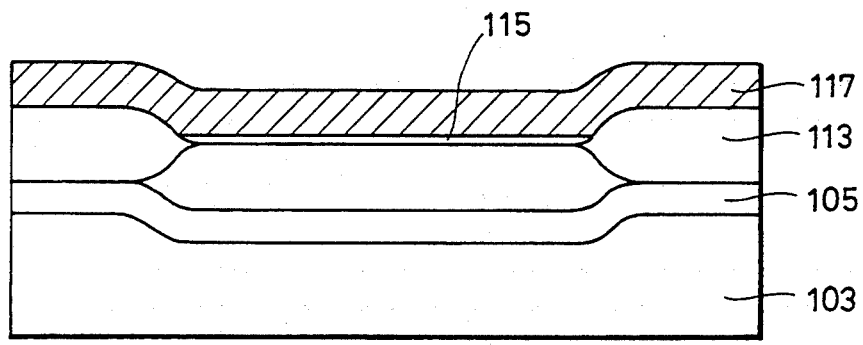
Figure 18:
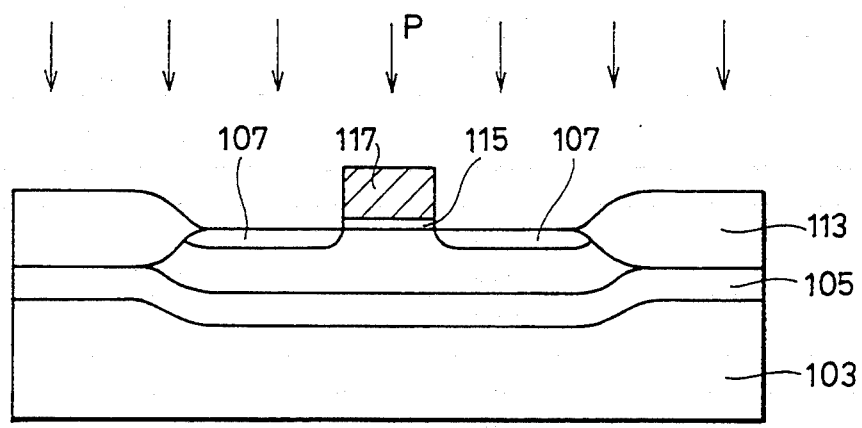
Figure 19:
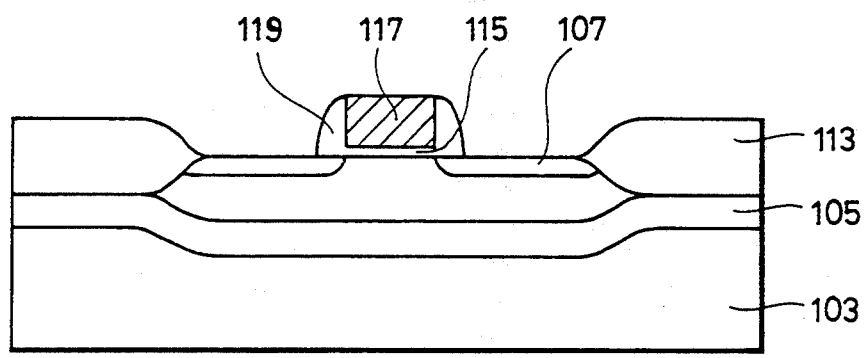
Figure 20:
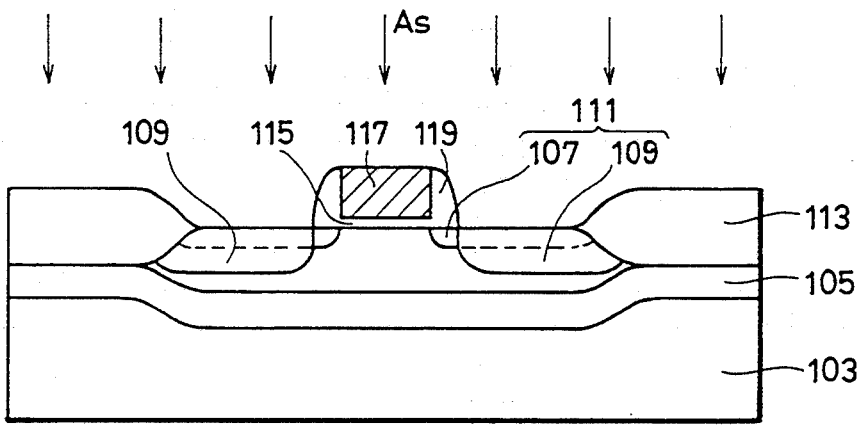
Figure 21A:
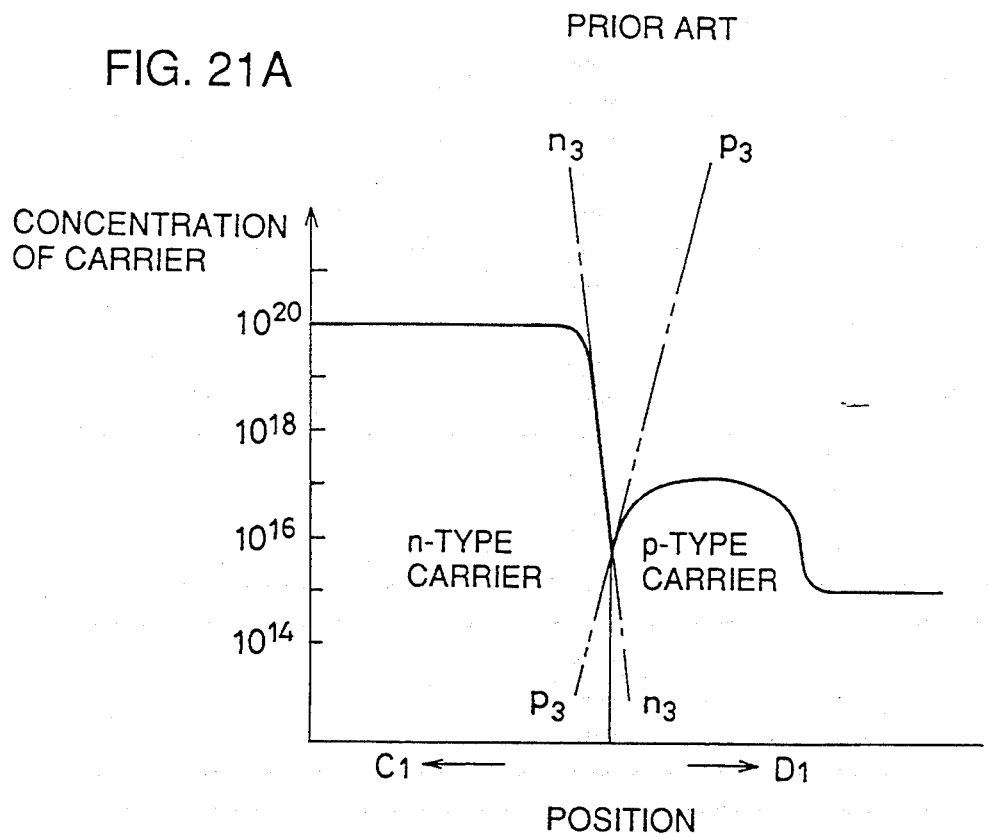
FIG. 21A shows change of carrier concentration at positions along line $C_1$-$D_1$ in FIG. 12.
Figure 21B:
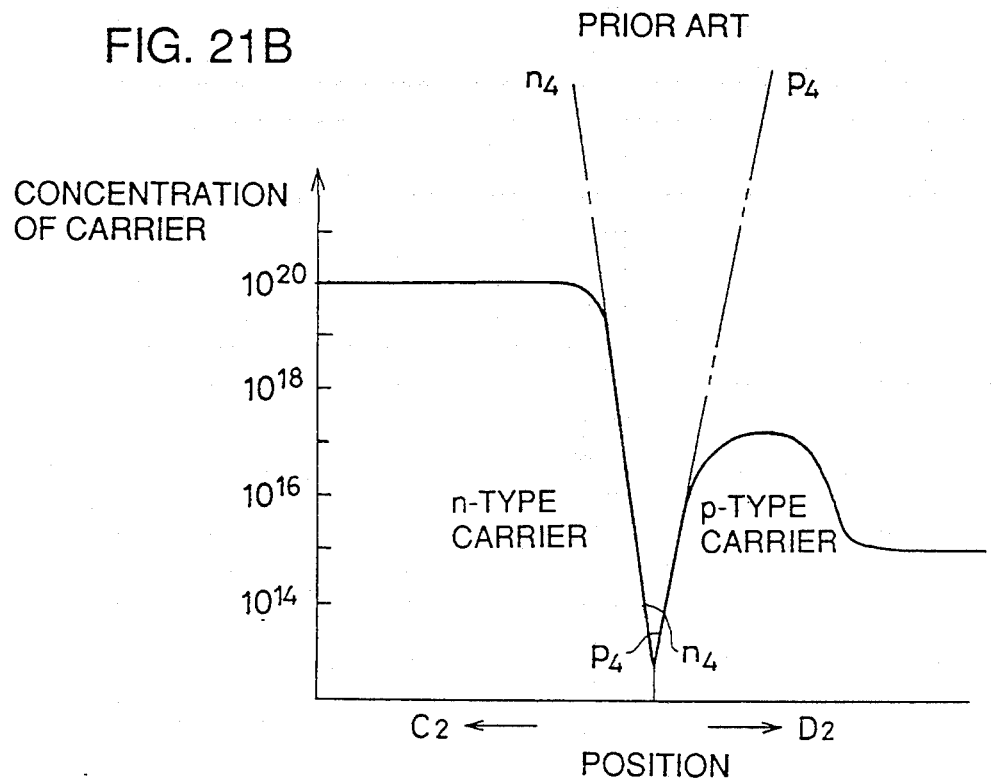
FIG. 21B shows change of carrier concentration at positions along line $C_2$-$D_2$ in FIG. 12.
Figure 22A:
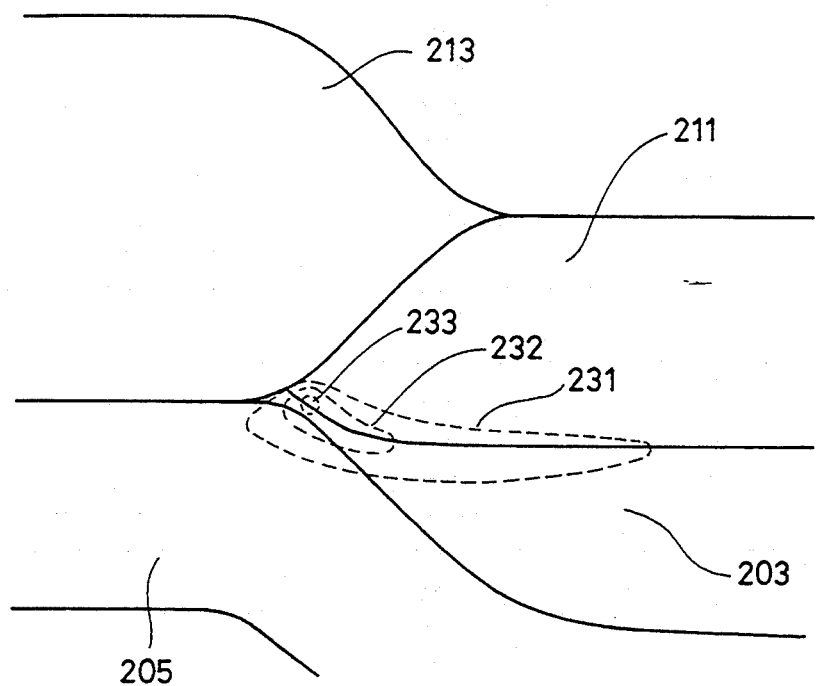
FIGS. 22A and 22B are schematic sections of a portion corresponding to a region R in FIG. 12 and shows results of simulation of field concentration.
Figure 22B:
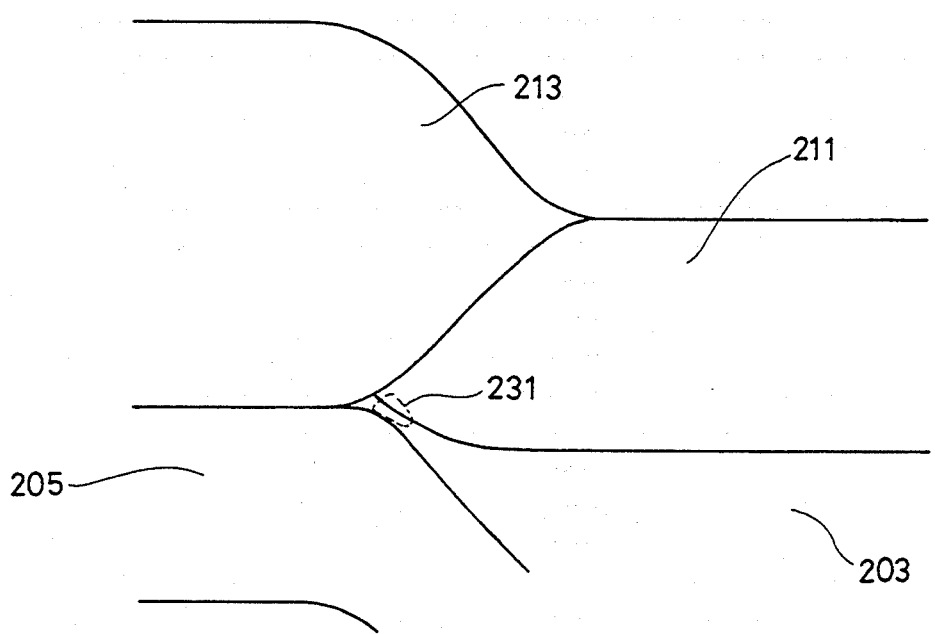
Figure 23:
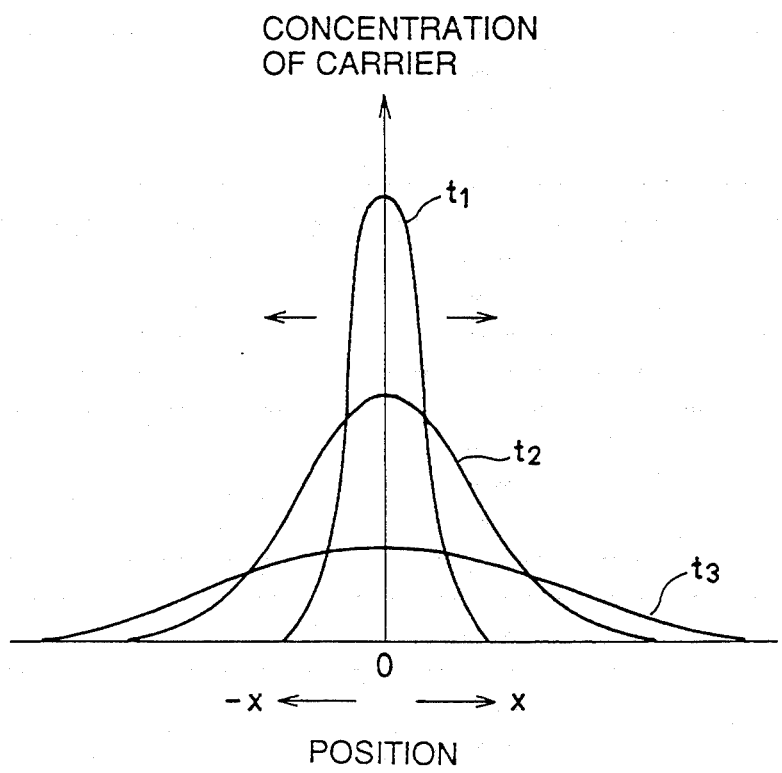
FIG. 23 is a diagram for showing that a diffusion current is liable to generate if a gradient of concentration of carrier is large.
Figure 24:
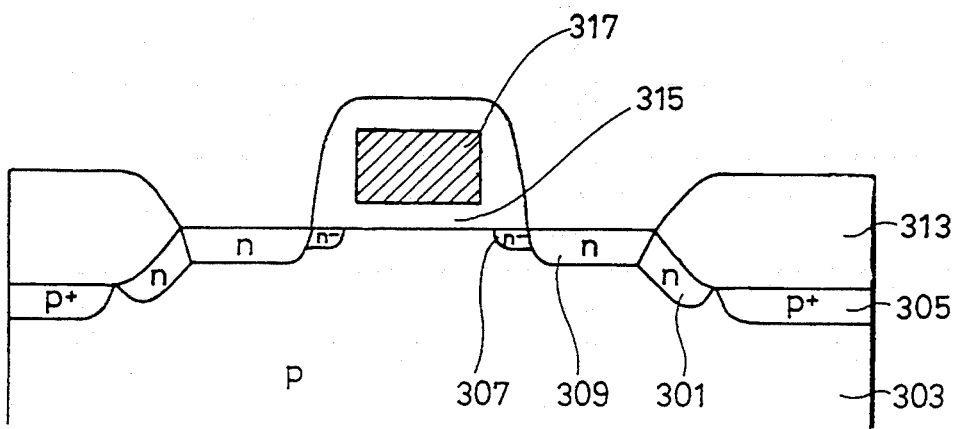
FIG. 24 is a schematic cross section of a semiconductor device already disclosed in a publication

Also in the case shown in FIGS. 1 and 11B, the n$^-$ impurity diffusion region 1 is formed between the p-type impurity diffusion region 5 and n$^+$ impurity diffusion region 9 by the ion implantation. The concentration of n-type carrier in the n$^-$ impurity diffusion region 1 is smaller than that in the n$^+$ impurity diffusion region 9. Therefore, the gradient of concentration of n-type carrier is small in the vicinity of the p-n junction, similarly to the case described above. Thus, according to the invention, the gradient of concentration of n-type carrier has a small absolute value, as indicated by alternate long and short dash line $n_2$—$n_2$, while the concentration in the prior art, which is indicated by dotted line, has the gradient indicated by alternate long and two short dashes line $n_4$—$n_4$. Along line $A_2$-$B_2$, the p-type impurity diffusion region 5 and n+ impurity diffusion region 9 are spaced through a long distance. Therefore, the ion, which is implanted for forming the n− impurity diffusion region 1, does not reach the p-type impurity diffusion region 9. Therefore, the gradient of concentration of only the n-type carrier is small at the vicinity of the p-n junction formed between the p-type impurity diffusion region 5 and n+ impurity diffusion region 9. The gradient of concentration of n-type carrier can be small at the vicinity of the p-n junction, as described above. Therefore, the leak current, which may be caused at the vicinity of the p-n junction formed between the p-type impurity diffusion region 5 and n+ impurity diffusion region 9, can be reduced, similarly to the foregoing case.

Owing to the provision of the n− impurity diffusion region 1, which is located between the n+ impurity diffusion region 9 and p-type impurity diffusion region 5 and is in contact with the n+ impurity diffusion region 9, as described above, the leak current, which may be caused at the vicinity of the p-n junction formed between the p-type impurity diffusion region 5 and n+ impurity diffusion region 9, can be reduced.

According to the manufacturing method of the n-channel transistor of an embodiment of the invention, the n− impurity diffusion region 1 is formed by the ion implantation of phosphorus (P) at the step shown in FIG. 10. A part of phosphorus thus ion-implanted remains in the n+ impurity diffusion region 9. Owing to the fact that the phosphorus which was implanted for forming the n− impurity diffusion region 1 remains in the n+ impurity diffusion region 9, the concentration of impurity in the n+ impurity diffusion region 9 is high. The high concentration of impurity in the n+ impurity diffusion region 9 can improve a current driving capacity of the n-channel transistor. According to the manufacturing method of the n-channel transistor of the embodiment, the concentration of impurity in the n+ impurity diffusion region 9 can be increased by the ion implantation which is carried out for forming the n− impurity diffusion region 1, and thereby the current driving capacity of the n-channel transistor can be improved.

Although the n-channel transistor has been described as the embodiment of the invention, the invention is not restricted to this, and can be applied to any element, in which the n-type and p-type impurity diffusion regions of relatively high concentrations are adjacent to each other and a reverse bias is applied to a junction between the n-type and p-type impurity regions.

In the semiconductor device according to the invention, the second impurity region is formed between the first impurity region of the second conductivity type and the peak of concentration of impurity of the first conductivity type. Therefore, the leak current, which may generate near the p-n junction, can be reduced, and thus the current driving capacity and the electrical reliability are improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type having a main surface and element forming regions at the main surface;
   a separating and insulating film formed in said main surface of said semiconductor substrate for separation of adjacent element forming regions;
   a region which has a peak concentration of impurity of the first conductivity type, located in said semiconductor substrate and extending from a lower surface of said separating and insulating film to a position at a predetermined depth in an individual element forming region;
   a first impurity region of a second conductivity type which has a first concentration, located in said individual element forming region adjacent to and in contact with said separating and insulating film and formed in said main surface of said semiconductor substrate above the region having a peak concentration of impurity of the first conductivity type; and
   a second impurity region of the second conductivity type, located adjacent to and below said first impurity region and between said first impurity region and said region having a peak concentration of the impurity of the first conductivity type, said second impurity region contacting said region having a peak concentration of the impurity of the first conductivity type and said first impurity region, said second impurity region having a second concentration lower than said first concentration.

2. A semiconductor device according to claim 1, wherein said first concentration is $10^{20}$ cm$^{-3}$, and said second concentration is in a range from $10^{17}$ cm$^{-3}$ to $10^{18}$ cm$^{-3}$.

3. A semiconductor device according to claim 1, wherein said first impurity region forms a part of a source region and a part of a drain region of a field effect transistor.

4. A semiconductor device according to claim 3, wherein each of said source region and said drain region includes an impurity region containing impurity at a relatively high concentration and an impurity region containing impurity at a relatively low concentration, and
   said first impurity region is said impurity region containing the impurity at said relatively high concentration.

5. A semiconductor device according to claim 4, wherein said relatively low concentration of the impurity is in a range from $10^{17}$ cm$^{-3}$ to $10^{18}$ cm$^{-3}$, said relatively high concentration of the impurity is $10^{20}$ cm$^{-3}$, and said second concentration is in a range from $10^{17}$ cm$^{-3}$ to $10^{18}$ cm$^{-3}$.

6. A semiconductor device comprising:
   a semiconductor substrate of a first conductivity type having a main surface and element forming regions at the main surface;
   a separating and insulating film formed in said main surface of said semiconductor substrate for separation of adjacent element forming regions;
   a region which has a peak concentration of impurity of the first conductivity type, located in said semiconductor substrate and extending from a lower surface of said separating and insulating film to a position at a predetermined depth in an individual element forming region;
a field effect transistor formed in said individual element forming region,
said field effect transistor including,
a pair of first impurity regions of a second conductivity type, which have a first concentration, located in said individual element forming region adjacent to and in contact with said separating and insulating film and formed in said main surface of said semiconductor substrate, above the region having a peak concentration of impurity of the first conductivity type, with a predetermined distance between each other, and
a gate electrode formed on a region located between said pair of first impurity regions with a gate insulating film therebetween; and
a pair of second impurity regions of the second conductivity type, which second impurity regions have a second concentration lower than said first concentration, in contact with said pair of first impurity regions, respectively, each of said second impurity regions being located adjacent to and below the respective one of said pair of first impurity regions and between said respective one of said pair of first impurity regions and said region having a peak concentration of the impurity of the first conductivity type, each of said second impurity regions contacting said region having a peak concentration of the impurity of the first conductivity type.

7. A semiconductor device comprising:
a semiconductor substrate of a first conductivity type having a main surface and element forming regions at the main surface;
a separating and insulating film formed in said main surface of said semiconductor substrate for separation of adjacent element forming regions;
a region which has a peak concentration of impurity of the first conductivity type, located in said semiconductor substrate and extending from a lower surface of said separating and insulating film to a position at a predetermined depth in an individual element forming region;
a field effect transistor formed in said individual element forming region,
said field effect transistor including,
a pair of first impurity regions of a second conductivity type, which have a first concentration, located in said individual element forming region adjacent to and in contact with said separating and insulating film and formed in said main surface of said semiconductor substrate, above the region having a peak concentration of impurity of the first conductivity type with a predetermined distance between each other,
a gate electrode formed on a region located between said pair of first impurity regions with a gate insulating film therebetween, and
a pair of second impurity regions of the second conductivity type, which have a second concentration lower than said first concentration, formed in said main surface of said semiconductor substrate, each of said second impurity regions being located between one of said pair of first impurity regions and said gate electrode; and
a pair of third impurity regions of the second conductivity type, which have a third concentration lower than said first concentration, in contact with said pair of first impurity regions, respectively, each of said third impurity regions being located adjacent to and below the respective one of said pair of first impurity regions and between the respective one of said pair of first impurity regions and said region having a peak concentration of the impurity of the first conductivity type., each of said third impurity regions contacting said region having a peak concentration of the impurity of the first conductivity type.

* * * * *